(12) United States Patent
Cheng et al.

(10) Patent No.: US 8,377,759 B2
(45) Date of Patent: Feb. 19, 2013

(54) CONTROLLED FIN-MERGING FOR FIN TYPE FET DEVICES

(75) Inventors: Kangguo Cheng, Guilderland, NY (US); Bruce B. Doris, Slingerlands, NY (US); Ali Khakifirooz, Slingerlands, NY (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 12/858,341

(22) Filed: Aug. 17, 2010

(65) Prior Publication Data

US 2012/0043610 A1 Feb. 23, 2012

(51) Int. Cl.
*H01L 21/336* (2006.01)

(52) U.S. Cl. .................. 438/151; 257/E29.242

(58) Field of Classification Search .............. 438/151, 438/283, 157; 257/347, E29.242
See application file for complete search history.

(56) References Cited

U.S. PATENT DOCUMENTS

| | | | |
|---|---|---|---|
| 7,456,471 B2 | 11/2008 | Anderson et al. | 257/331 |
| 7,692,254 B2 | 4/2010 | Anderson et al. | 257/401 |
| 7,799,592 B2 * | 9/2010 | Lochtefeld | 438/44 |
| 2005/0224880 A1 * | 10/2005 | Lee et al. | 257/347 |
| 2005/0250285 A1 * | 11/2005 | Yoon et al. | 438/283 |
| 2006/0125008 A1 * | 6/2006 | Chidambarrao et al. | 257/347 |
| 2007/0272925 A1 * | 11/2007 | Choi et al. | 257/51 |
| 2007/0287256 A1 | 12/2007 | Chang et al. | 438/283 |
| 2008/0054361 A1 * | 3/2008 | Siprak | 257/365 |
| 2008/0149984 A1 * | 6/2008 | Chang et al. | 257/314 |

OTHER PUBLICATIONS

U.S. Appl. No. 12/786,397, filed May 24, 2010, Cheng.

* cited by examiner

*Primary Examiner* — Nathan Ha
(74) *Attorney, Agent, or Firm* — George Sai-Halasz; Louis J. Percello

(57) ABSTRACT

A method for fabricating FET devices is disclosed. The method includes forming continuous fins of a semiconductor material and fabricating gate structures overlaying the continuous fins. After the fabrication of the gate structures, the method uses epitaxial deposition to merge the continuous fins to one another. Next, the continuous fins are cut into segments. The fabricated FET devices are characterized as being non-planar devices. A placement of non-planar FET devices is also disclosed, which includes non-planar devices that have electrodes, and the electrodes contain fins and an epitaxial layer which merges the fins together. The non-planar devices are so placed that their gate structures are in a parallel configuration separated from one another by a first distance, and the fins of differing non-planar devices line up in essentially straight lines. The electrodes of differing FET devices are separated from one another by a cut defined by opposing facets of the electrodes, with the opposing facets also defining the width of the cut. The width of the cut is smaller than one fifth of the first distance which separates the gate structures.

10 Claims, 5 Drawing Sheets

CONTROLLED FIN-MERGING FOR FIN TYPE FET DEVICES

BACKGROUND

The present invention relates to electronic devices of very large scale integration (VLSI) circuits. In particular, it relates to fin type non-planar FET (Field-Effect-Transistor) devices.

As FET devices are being scaled down, the technology becomes more complex, and changes in device structures and new fabrication methods are needed to maintain the expected performance improvements from one successive device generation to the next. non-planar devices offer possible avenues to continue on the path of miniaturization.

BRIEF SUMMARY

A method for fabricating FET devices is disclosed. The method includes forming continuous fins of a semiconductor material and fabricating gate structures overlaying the continuous fins. After the fabrication of the gate structures, the method uses epitaxial deposition to merge the continuous fins to one another. Next, the continuous fins are cut into segments. The fabricated FET devices are characterized as being non-planar devices.

A placement of non-planar FET devices is also disclosed, which includes non-planar devices that have electrodes, and the electrodes contain fins and an epitaxial layer which merges the fins together. The non-planar devices are so placed that their gate structures are in a parallel configuration separated from one another by a first distance, and the fins of differing non-planar devices line up in essentially straight lines. The electrodes of differing FET devices are separated from one another by a cut defined by opposing facets of the electrodes, with the opposing facets also defining the width of the cut. The width of the cut is smaller than one fifth of the first distance which separates the gate structures.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Figure 1:
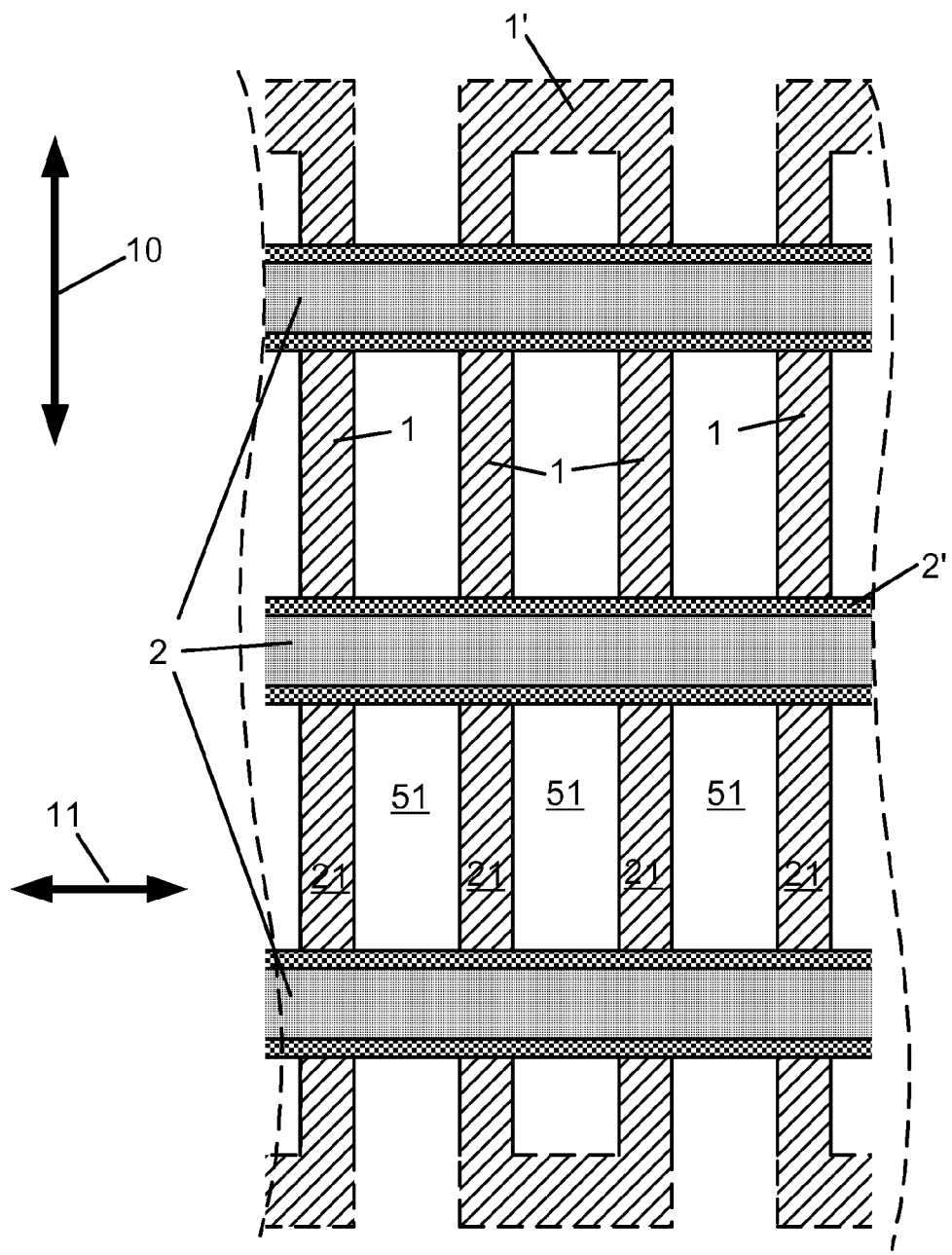
FIG. 1 shows a schematic top view of a fins and gate structures formation in an embodiment of the invention.

It is understood that Field Effect Transistor-s (FET) are well known in the electronic arts. Standard components of an FET are the source, the drain, the body in-between the source and the drain, and the gate. The gate is overlaying the body and is capable to induce a conducting channel in the body between the source and the drain. In the usual nomenclature, the channel is hosted by the body. The gate is typically separated from the body by the gate insulator, or gate dielectric. Depending whether the "on state" current in the channel is carried by electrons or by holes, the FET comes in two types: as NFET or PFET. (In different nomenclature the NFET and PFET devices are often referred to as NMOS and PMOS devices.)

There are FET devices that have a non-planar, three dimensional geometric configuration. These devices are three dimensional because they are hosted by fin structures. In fin type devices the body of the transistor is formed in a fin rising out of a planar background, typically having both vertical and horizontal surfaces. The gate of the non-planar device may engage the vertically oriented body surfaces, or sidewalls, and the top surface, as well, resulting in several planes being used for transistor channel formation. In some other typical non-planar devices the gate of the non-planar device may not engage the top surface only the vertically oriented body surfaces. There are further variations of non-planar devices, for instance some with multi faceted fins and multiple sidewall sections. In the nomenclature of the art, non-planar fin type devices where the device gate engages the fin top surface, as well as the sidewall surfaces, are called TriGate devices, and the ones where only the sidewall surfaces are engaged by the gate are called FinFET devices.

Non planar FET devices, with fin type bodies, have several advantages compared to planar devices, as it is known in the art. In embodiments of the present invention, the dimensions of fin structures that serve as fin type device bodies may be of a height of about 5 nm to 70 nm, and of a width of between 3 nm to about 50 nm, and they may be Fin-FET, TriGate, or any other FET device based on fins. In the followings, unless specifically mentioned which three dimensional FET is being discussed, the terms "fin type", or "non-planar", device will be used to express general three dimensional devices.

In the VLSI art as it presently stands, the fabrication of fin type devices follows a standard sequence. This standard sequence commences with the formation of fins. At this stage the fins are continuous with a length sufficient to accommodate many devices along their extension. Ensuing the forming of the fins, the fins are being cut into segments of right size to host individual devices. Because of some advantages, it is usual in the processing arts to completely finish fabricating a given level of the device before commencing on other levels. It is for this reason that the fins are being cut after their fabrication and before other major sequence of steps are being taken for processing other levels. After cutting the fins, the ensuing steps of the prior art that may be of interest for the embodiments of the present disclosure, are the gate structure formation, and following gate structure formation, the epitaxial merging of the fins to lower source/drain resistance. Because in the present art the fins are being cut before the fin-merging epitaxial growth, the cut fin ends, or ending facets of the fins are being exposed to epitaxy. Consequently, the epitaxial growth which follows will also take place at the exposed end facets of the fins. This growth at the exposed end facets is unwanted, and has disadvantages. It may cause potential shorts amongst the two ends of neighboring fins. Furthermore, fin erosion during the gate structure fabrication will be exaggerated by the exposed ends of the fins, causing variation in the epitaxial process of fin-merging.

Embodiments of the instant invention teach a method for forming fin type FET devices without the problems arising from the exposed fin endings. In the method of the present embodiments the fins are being cut after gate structure processing and after the fin-merging epitaxial growth have already taken place. The resulting devices may be placed in configurations with a previously unattainable density. The reason is that the devices may be located nearer to one another due to the lack of epitaxial layer variation at the fin ends, which could cause potential shorts between two neighboring fins. Accordingly, the process flow of embodiment of the instant invention may be as following. First, one may form the fins as is done in the known VLSI art. Next, fabricate the gate structures. Ensuing the gate structure fabrication, comes the epitaxial growth to merge the fins. And, only after the epitaxy has been completed, are the fins being cut. In this way the fins have smooth end facets, without protrusions due to unwanted epitaxial growth. With the resulting of smaller probability of shorting between the ends of the fins one may place the devices nearer to one another and increase density, which is always a sought after advantage in device fabrication.

Manufacturing of NFET, PFET, and fin type devices, is established in the VLSI art. It is understood that there are large number of steps involved in such processing, and each step may have practically endless variations, known to those skilled in the art. For embodiments of this disclosure it is understood that the whole range of known processing techniques are available for fabricating the devices, and only those process steps will be detailed that are related to the embodiments of the present invention.

FIG. 1 shows a schematic top view of a fins and gate structures formation in an embodiment of the invention. This is the state of fabrication in a representative embodiment of the invention after the formation of fins 1 and the fabrication of the gate structures 2. FIG. 1 notes with double ended arrows, 10, 11, two direction useful to describe the various formations, these directions are the length direction 10, and the width direction 11. The length direction 10 and the width direction 11 are perpendicular to one another. Up to this stage, the fins 1 have not been cut to be separated into various segments for individual devices. Each one of the fins 1 is continuous, extending in a length direction 10. The fins are being spaced apart of each other in the width direction 11. The fins 1 may be fabricated in any known way of the art. Without intent of limiting, FIG. 1 schematically depicts a situation where the fins 1 have been formed by so called sidewall imaging transfer techniques. Sidewall imaging transfer techniques allow for fabrication of structures that in some dimensions are smaller than lithography would be capable of defining. The connecting portions 1' at the end of pairs of fins, delimited in the figures with dashed lines indicating that they in general may not be present, are a mark of sidewall imaging transfer techniques. The fins 1 have top surfaces 21 that are spaced away, and are substantially in parallel with, the principal surface 51 of a support member of the whole production.

The gate structures 2 are overlaying the continuous fins 1 in the width direction 11, and are spaced apart of each other in the length direction 10. The terminology of "gate structure" is intended to convey a broad interpretation for these structures. The term gate structure includes gate stacks, any sidewall structures 2', and any gate insulators, underneath the gate stacks. There are many variation known in the art in regard to any of these structures, and none are excluded in the embodiments of the present invention. As examples, and without limiting, the gate structures may have oxide dielectric or high-k dielectric gate insulators; the gate structures may have polysilicon gates or metal gates, or any further kind. The fabrication of the gate structures may be of so called gate first, or gate last, kinds.

FIG. 1 shows what may be only a small fraction of a larger IC on a chip. This is depicted on various figures by the wavy dashed line boundaries. The figure shows only three gate structures 2 and four fins 1. This should not be interpreted in a limiting fashion. There may be thousands of gate structures and fins involved instead of the few shown in FIG. 1. At the same time, one may deal only with the minimum of one gate structure and two fins.

The material of the semiconductor fins 1 may be a Si based material, which may be essentially pure silicon (Si), but may also be a silicon-germanium (SiGe) alloy, or Si with carbon Si:C. However, compound semiconductors are not excluded from embodiments of the invention. The fin material in representative embodiments of the invention is in single-crystalline form.

In typical embodiments of the instant invention the fins 1 are formed over the principal surface 51 of a support member. The support member may be a buried oxide layer (BOX) on top of a semiconductor substrate. Such BOX layers are typical in the art, but embodiments of the present invention do not depend on the BOX/substrate combination, other schemes known in the art are included, as well.

Figure 2:
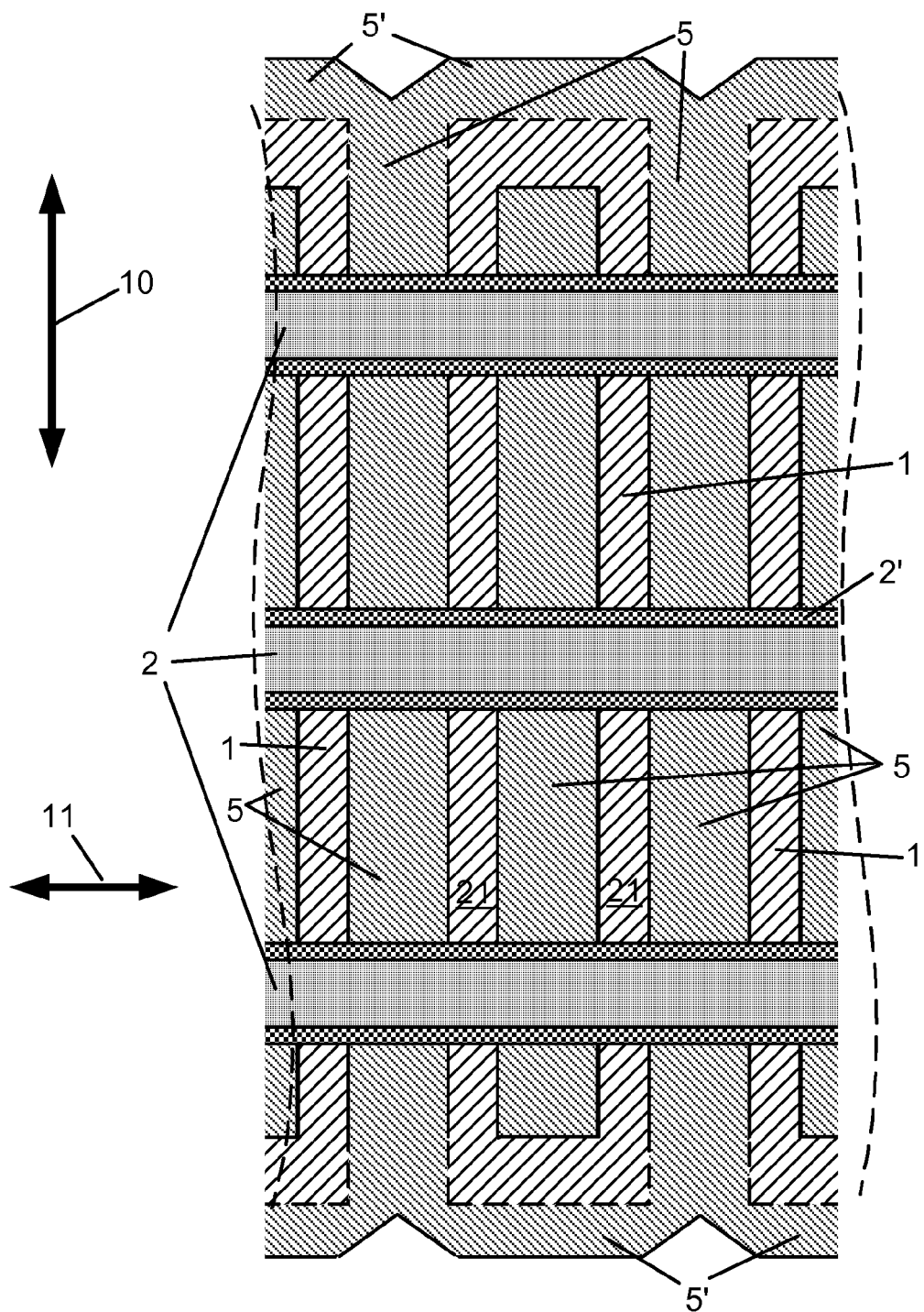
FIG. 2 shows a schematic top view of a stage in the fabrication after epitaxial layer deposition for an embodiment of the invention.

FIG. 2 shows a schematic top view of a stage in the fabrication after epitaxial layer deposition for an embodiment of the invention. Depositing an epitaxial layer 5 which merges the fins together is a known technique in the art for lowering the source/drain resistance. As is evident in FIG. 2, the epitaxial deposition was carried out without previously cutting the continuous fins 1. The material of the epitaxial layer 5 may typically also be a silicon based material, but may not necessarily have the same material composition as the fins 1. At the same time it may also happen that they have the same composition, for instance both may be of essentially pure Si.

Epitaxial deposition is a known technique of the VLSI fabrication art. In describing a structure, the adjective "epitaxial" is typically used to indicate that a particular material has been epitaxially deposited. The structural consequence of epitaxial deposition is that the deposited material and the host material, at their common interface, have the same symmetry and crystalline orientation. Further terms that may be used, such as "epitaxial relation", "epitaxially", "epitaxy", "epi", "epitaxial growth" etc. carry their customary usage, namely crystalline continuity across the interface. Typical techniques used in epitaxy may include molecular beam epitaxy (MBE), chemical vapor deposition (CVD), ultra high vacuum CVD (UHCVD), rapid thermal CVD (RTCVD), or further known methods.

The epitaxial merging of the fins 1 is typically done in a manner of selective deposition, meaning that growth may occur only on surfaces of the proper material with the right crystalline orientation. FIG. 1 shows no evidence of epitaxial layer 5 deposition on the top surfaces 21 of the fins 1. For further processing of the devices, and for better device performance, absence of epitaxy on the top surfaces 21 of the fins 1 is desirable. There are various ways to avoid the epitaxy on top of the fins. One may leave in place from earlier processing steps a hard-mask protecting the fins. Alternatively, one may etch away the epitaxial layer from the fin top surfaces 21, by a dry or by a wet etch. Such etching may be facilitated if the epitaxial layer has a different material composition than that of the fins. However, even in the case of identical compositions, one may use timed etching. Usually, for FinFETs one may apply a hard-mask approach, while for TriGate devices etching may be preferable.

FIG. 2 also indicates that the epitaxial layer 5 did deposit 5' at the fin endings, and it forms undesirable uneven protrusions. This is the type of deposition 5' that gives rise to the desirability to leave the fins 1 continuous at the time of the epitaxial merging.

Figure 3:
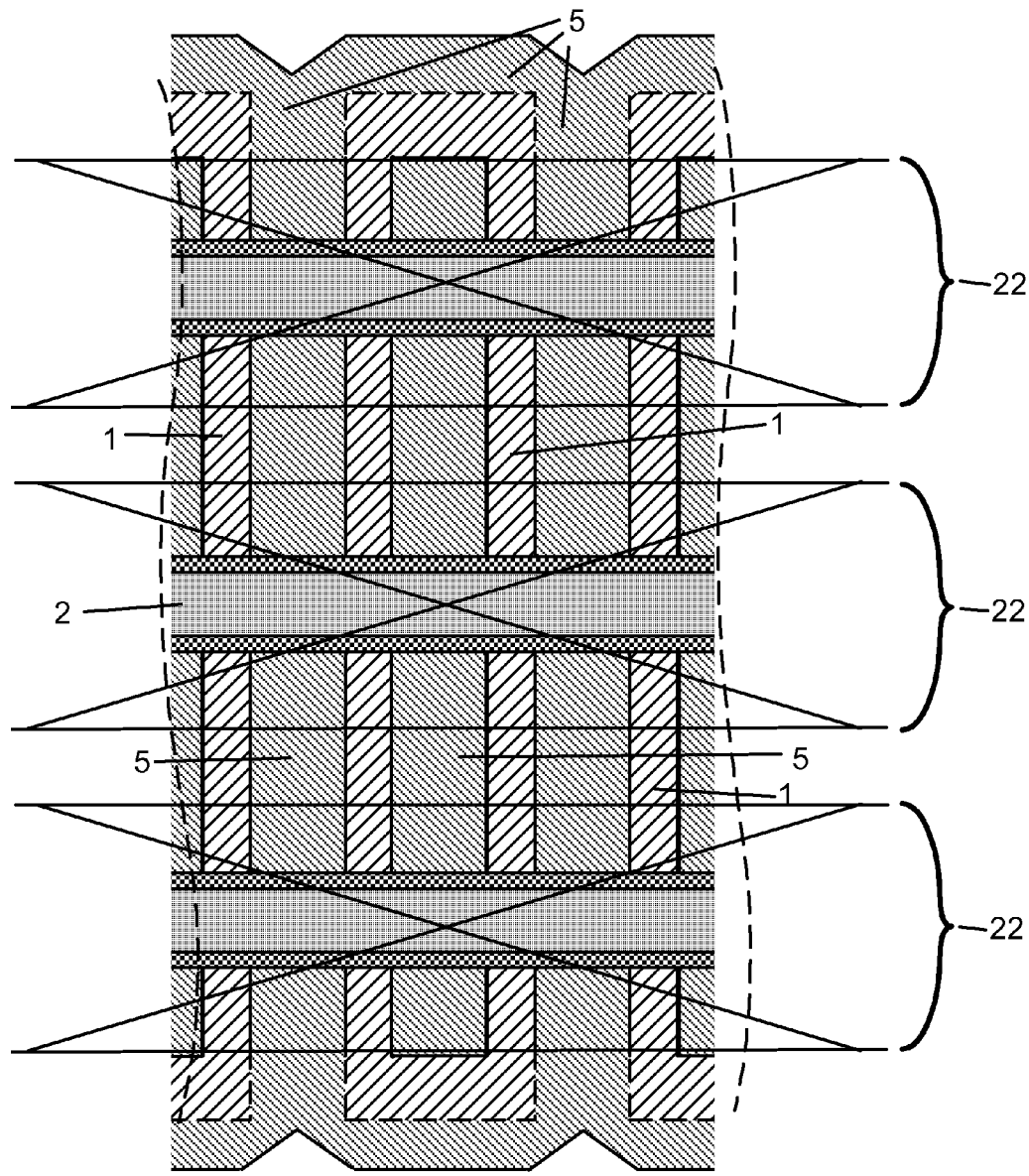
FIG. 3 symbolically shows deployment of masks for cutting the fins.

FIG. 3 symbolically shows deployment of masks for cutting the fins, displaying the evolution of embodiments of the method in preparation for cutting the fins. One deploys masks 22 over the future individual device segments, typically with one gate per segment. The depiction of the masks is symbolic, namely in reality they would not be transparent. The reason for this symbolic representation is that in this way it is observable what is underneath the masks. The cuts will occur where the fins 1 and the epitaxial layer 5 are left unprotected by the masks.

There are also known means in the art for using non lithography techniques to effect the needed cutting of the fins. In such a case the width 32 of the cut may be smaller than the minimum lithographic line-width. Such non lithography techniques may include, without limitation, sidewall imaging transfer techniques, or, for instance, using lithography for masking, but adding a spacer on the sidewall of the masking layer 22 to narrow the cut opening.

Figure 4:
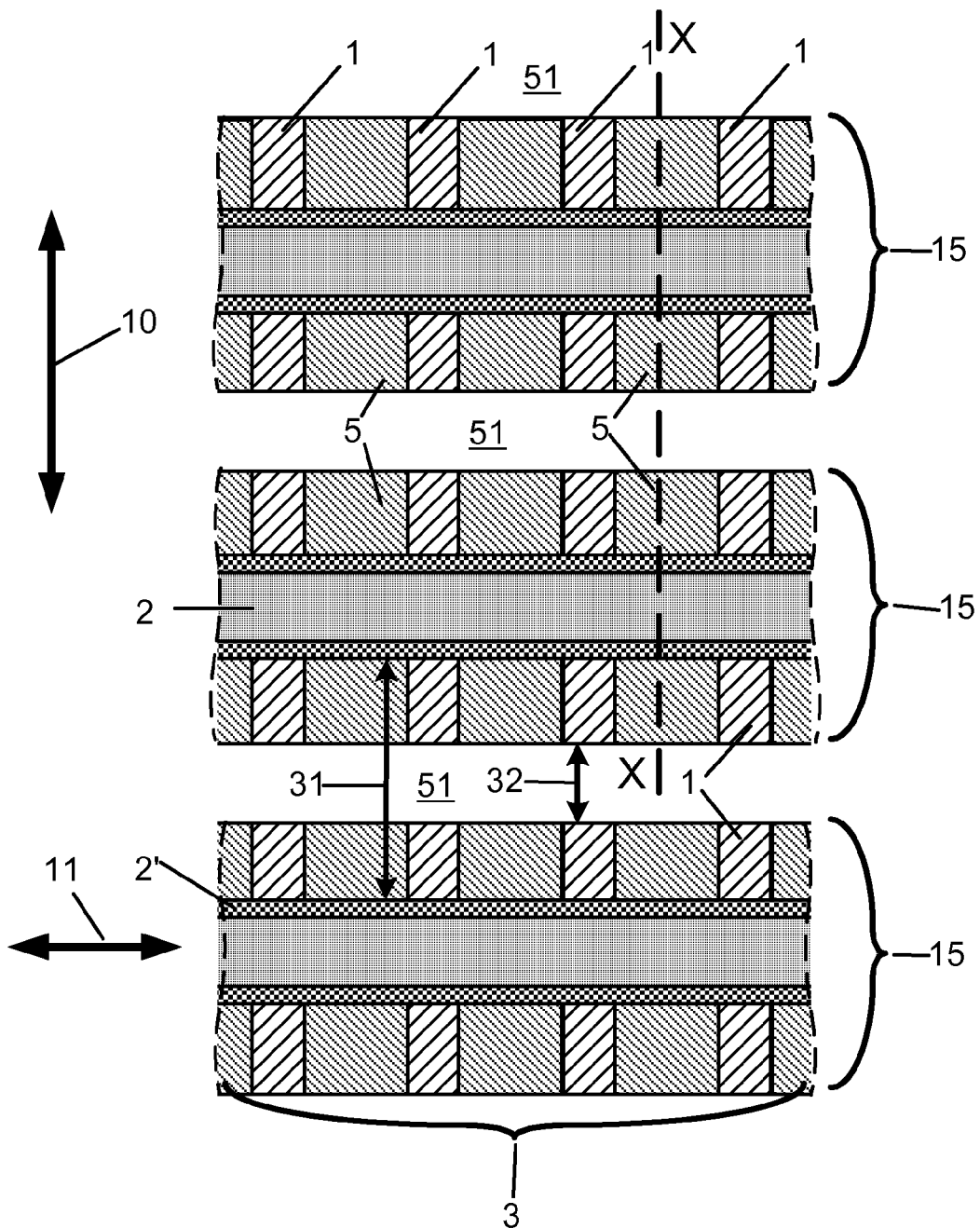
FIG. 4 shows a schematic top view of a stage in the fabrication after the fins have been cut and devices have been segmented in an embodiment of the invention.

FIG. 4 shows a schematic top view of a stage in fabrication after the fins have been cut, and devices have been segmented in an embodiment of the invention. Cutting of the fins 1 in the gaps between the masks 22 may follow known patterning and etching procedures of the VLSI arts, such as, for instance, reactive ion etching (RIE). The cut penetrates all the way down to the principal surface 51 of the support member. The cutting occurred along the width direction 11 in-between pairs of the gate structures 2. The originally continuous fins have been cut into segments 15, with each of the gate structures 2 being part of one of the segments 15. The electrodes 3 of the fin type devices are now separated from one another by the cut defined by opposing facets of the electrodes 3. All vertical surfaces are cleanly cut, with no non-uniform epitaxial layer on the fin endings, as it would be the case for the presently known art. Since the separations between the segments 15 are well defined and sharp, the whole of the segments may be packed more densely than it was previously possible. Less tolerance to avoid shorting is needed between the segments when the cuts are sharply defined.

The gate structures 2 in their parallel configuration are separated from one another by a first distance 31, and the cuts separating the electrodes may be characterized by their width 32. The dashed line between X-s indicates the place of a cross sectional view that is presented in FIG. 5.

Figure 5:
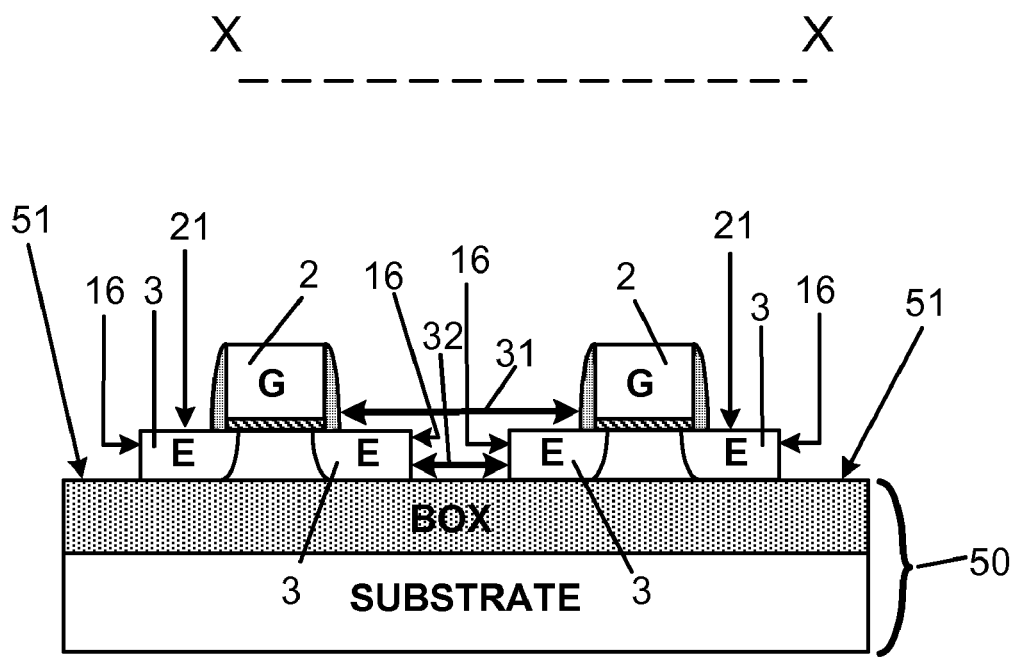
FIG. 5 shows a schematic cross sectional view of densely spaced fin type devices for an embodiment of the invention.

FIG. 5 shows a schematic cross sectional view of densely spaced fin type devices for an embodiment of the invention. The direction of the X-X line of FIG. 4 is indicated at the top of the figure. The figure shows only two of the fin type devices, but it is sufficient as illustration of representative embodiments. The devices lay on the principal surface 51 of a support member 50. The figure shows a support member which is a typical one found in the art, with a buried oxide layer (BOX) supporting the devices, while the BOX in formed over a substrate. The cross sectional line runs in the middle of the fins, following a straight line across two segments. The fins outside of the gate structures 2 are forming portions of the electrodes 3, while further portions of the electrodes are formed by the epitaxial layer 5, which is not visible in FIG. 5. It is understood that individual electrodes may be either the source or the drain of a given fin type device. The result of the cutting of the fins after the merging epitaxial deposition is that the electrodes 3 of differing ones of the FET devices are separated from one another by a cut defined by the electrodes opposing facets 16. These opposing facets 16 are essentially perpendicular to the principal surface 51 of the support member 50, and the facets 16 reach all the way down to the principal surface 51. The facets 16 due to the way they were fabricated may be characterized as being smooth. Smoothness in this context means that if there are any protrusions on the facets, such protrusions would have at most an extension into the cut which is less than 20% of the width 32 of the cut, with a more typical value being a less than 10% extension.

Since the separation of the electrodes 3 is well defined, one may pack the device segment closely together. This closeness would mean that the width 32 of the cut may be less than one fifth, 20%, of the first distance 31 separating the gate structures. The first distance 31 separation of the gate structures 2 may revolve around considerations of contacting the electrodes and the minimum available lithography line-width. The cut itself may be produced by non-lithographic methods of the art, hence the cut width 32 may be less than 20% of the gate structure 2 first distance 31 separation.

After the depictions of FIGS. 4 and 5, the fin type device fabrication would follow known method of the VLSI art, until full completion. Such further processing may entail, for instance, filling the cuts with some type of dielectric material, such as without limitation, oxide.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under", "upper", "side", "over", "underneath", "perpendicular", "length or width directions", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as "before", "after", "ensuing", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. A method for fabricating FET devices, said method comprising:
  forming continuous fins of a semiconductor material over a principal surface of a support member;
  fabricating gate structures overlaying said continuous fins;
  ensuing said fabricating of said gate structures, using an epitaxial deposition to merge said continuous fins to one another with an epitaxial layer;

ensuing said epitaxial deposition, cutting said continuous fins into segments, wherein each of said gate structures is comprised by one of said segments; and characterizing said FET devices as being non-planar devices.

2. The method of claim 1, wherein said method further comprises:

in forming said continuous fins, extending each one of said continuous fins in a length direction, and spacing said continuous fins apart of each other in a width direction, wherein said width direction is substantially perpendicular to said length direction;

in fabricating said gate structures, overlaying said continuous fins in said width direction, and spacing said gate structures apart of each other in said length direction; and in cutting said continuous fins, performing said cutting along said width direction in-between pairs of said gate structures.

3. The method of claim 1, wherein said continuous fins have top surfaces, which top surfaces are spaced away and are substantially in parallel with said principal surface of said support member, said method further comprises:

keeping said top surfaces clear from said epitaxial layer.

4. The method of claim 3, wherein said method comprises:

covering said top surfaces with a hard-mask prior to said epitaxial deposition.

5. The method of claim 3, wherein said method comprises:

etching away said epitaxial layer from said top surfaces after said epitaxial deposition.

6. The method of claim 2, wherein said spacing separates said gate structures from one another by a first distance, and said cutting effects a cut separating said segments, wherein said cut has a width, said method comprises:

selecting said width to be smaller than one fifth of said first distance.

7. The method of claim 1, wherein said method further comprises:

selecting said semiconductor material to be a silicon based single crystal material.

8. The method of claim 1, wherein said method further comprises:

processing to conclusion said segments that comprise said gate structures, whereby completing fabrication of said non-planar devices.

9. The method of claim 1, wherein said method further comprises:

selecting said non-planar devices to be FinFET devices.

10. The method of claim 1, wherein said method further comprises:

selecting said non-planar devices to be TriGate devices.

* * * * *